US012581694B2

(12) United States Patent
Hanada

(10) Patent No.: US 12,581,694 B2
(45) Date of Patent: Mar. 17, 2026

(54) SEMICONDUCTOR DEVICE AND DISPLAY DEVICE

(71) Applicant: Magnolia White Corporation, Tokyo (JP)

(72) Inventor: Akihiro Hanada, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 554 days.

(21) Appl. No.: 18/155,083

(22) Filed: Jan. 17, 2023

(65) Prior Publication Data

US 2023/0231056 A1 Jul. 20, 2023

(30) Foreign Application Priority Data

Jan. 19, 2022 (JP) ................................. 2022-006547

(51) Int. Cl.
*H10D 30/67* (2025.01)
*G02F 1/1362* (2006.01)
*G02F 1/1368* (2006.01)

(52) U.S. Cl.
CPC ................... *H10D 30/6755* (2025.01); *G02F 1/136286* (2013.01); *G02F 1/1368* (2013.01)

(58) Field of Classification Search
CPC .......... H10D 30/6755; G02F 1/136286; G02F 1/1368
See application file for complete search history.

(56) References Cited

U.S. PATENT DOCUMENTS

2018/0286890 A1* 10/2018 Suzumura ......... H01L 21/47635
2018/0342536 A1* 11/2018 Suzumura ......... G02F 1/136209
2020/0152802 A1* 5/2020 Takeda ...................... G09F 9/30
2020/0251505 A1* 8/2020 Watakabe .............. H10D 86/60
2020/0259020 A1* 8/2020 Watakabe .......... H10D 30/6739
2020/0350341 A1* 11/2020 Hanada ................ H10D 86/471
2021/0273108 A1* 9/2021 Hayashi ............. H10D 30/6755

FOREIGN PATENT DOCUMENTS

WO 2018/225690 A1 12/2018

* cited by examiner

*Primary Examiner* — Jeff W Natalini
*Assistant Examiner* — Rose Keagy
(74) *Attorney, Agent, or Firm* — XSENSUS LLP

(57) ABSTRACT

According to one embodiment, a semiconductor device includes a first gate electrode formed integrally with a scanning line, an oxide semiconductor layer, first and second signal lines which are in contact with the oxide semiconductor layer, and a second gate electrode provided so as to face the first gate electrode across the oxide semiconductor layer therebetween and connected to the first gate electrode. The second gate electrode is provided between the first signal line and the second signal line and does not overlap the first signal line or the second signal line.

17 Claims, 16 Drawing Sheets

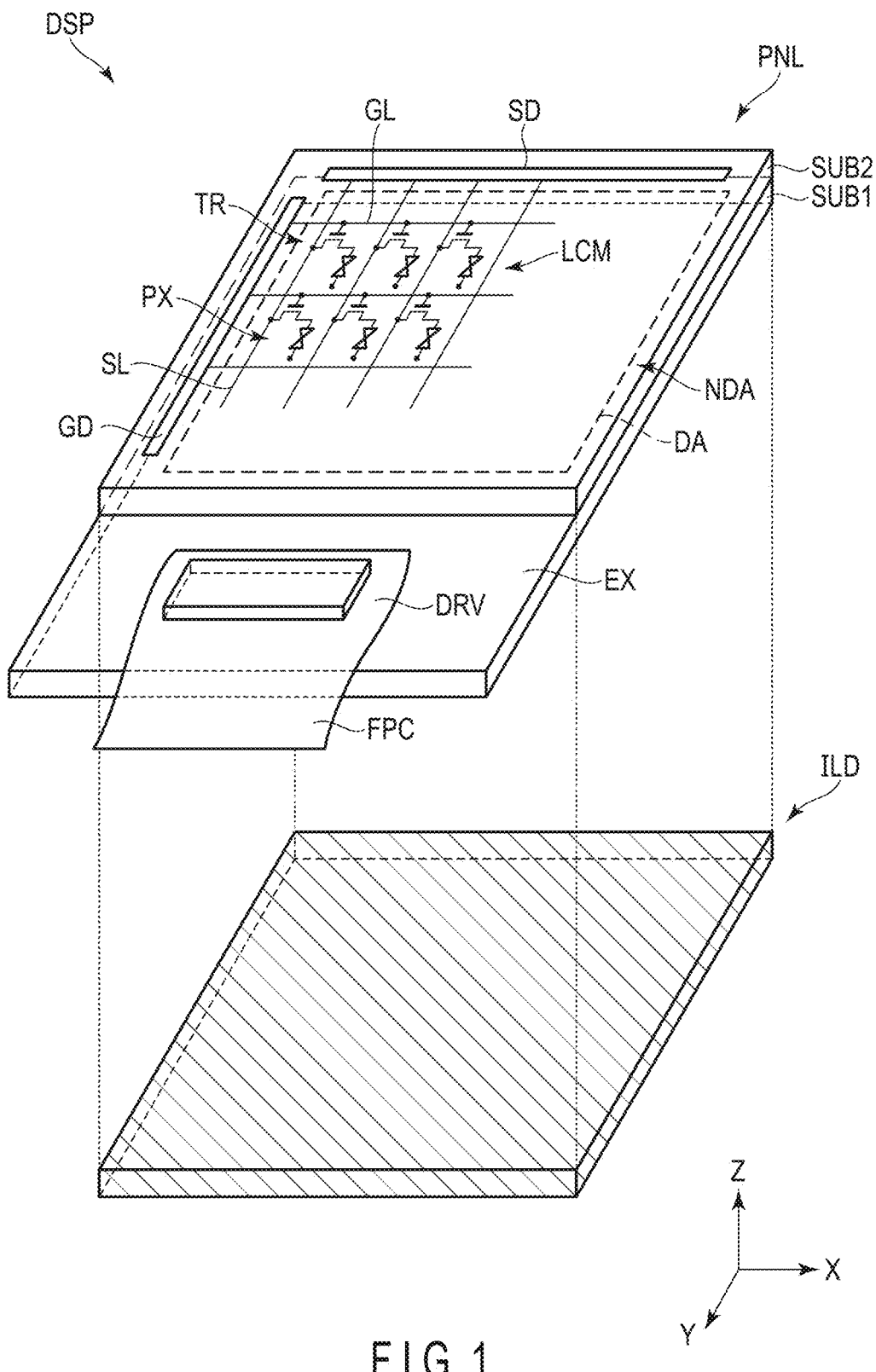
F I G . 1

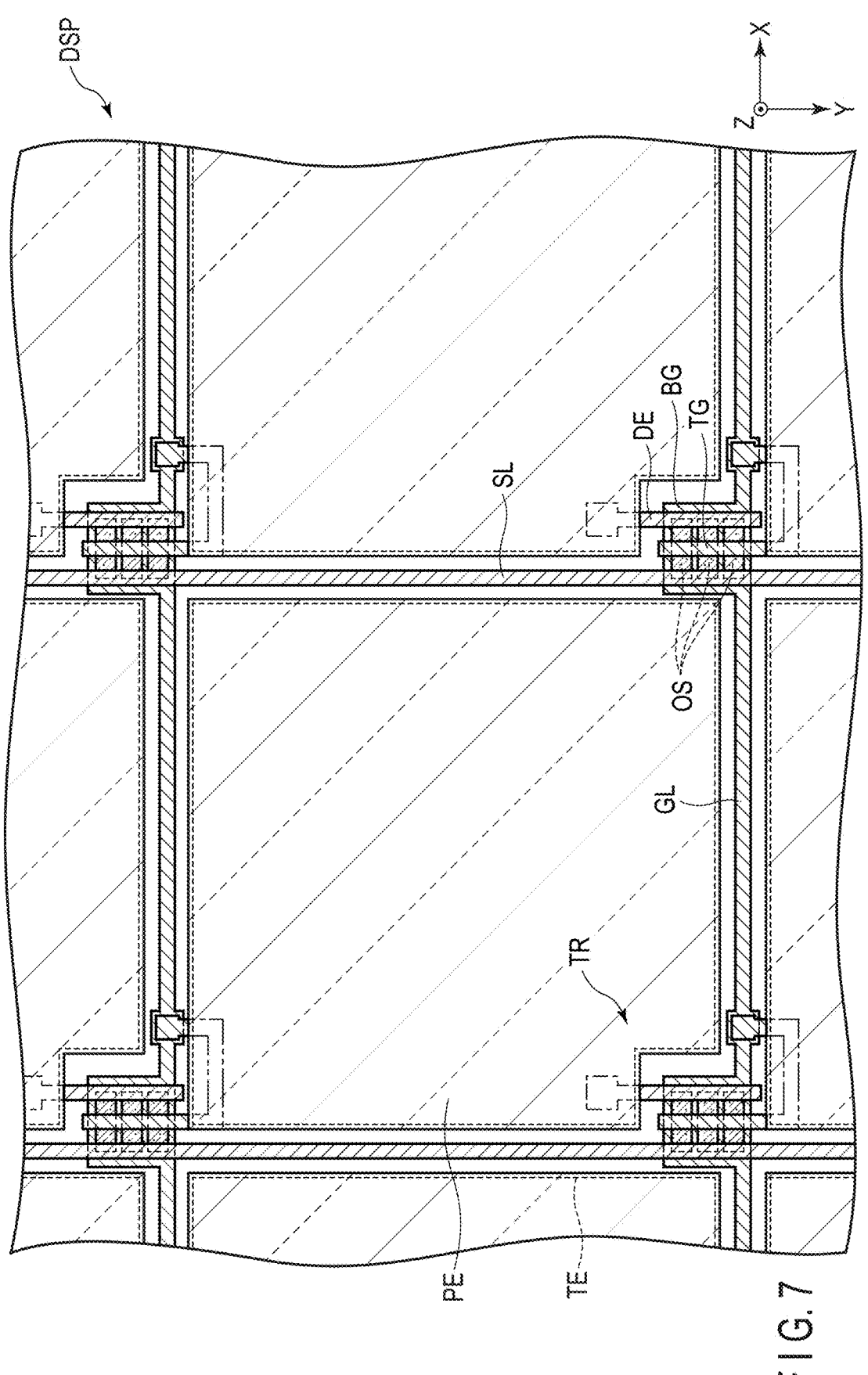
F I G. 7

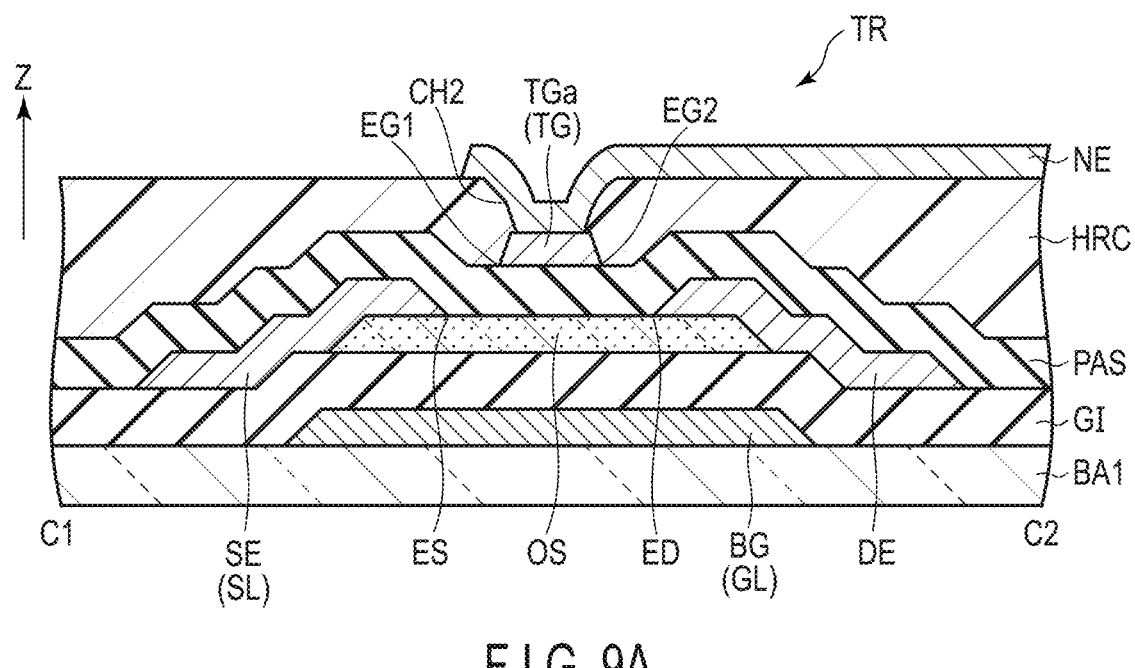
F I G. 9A
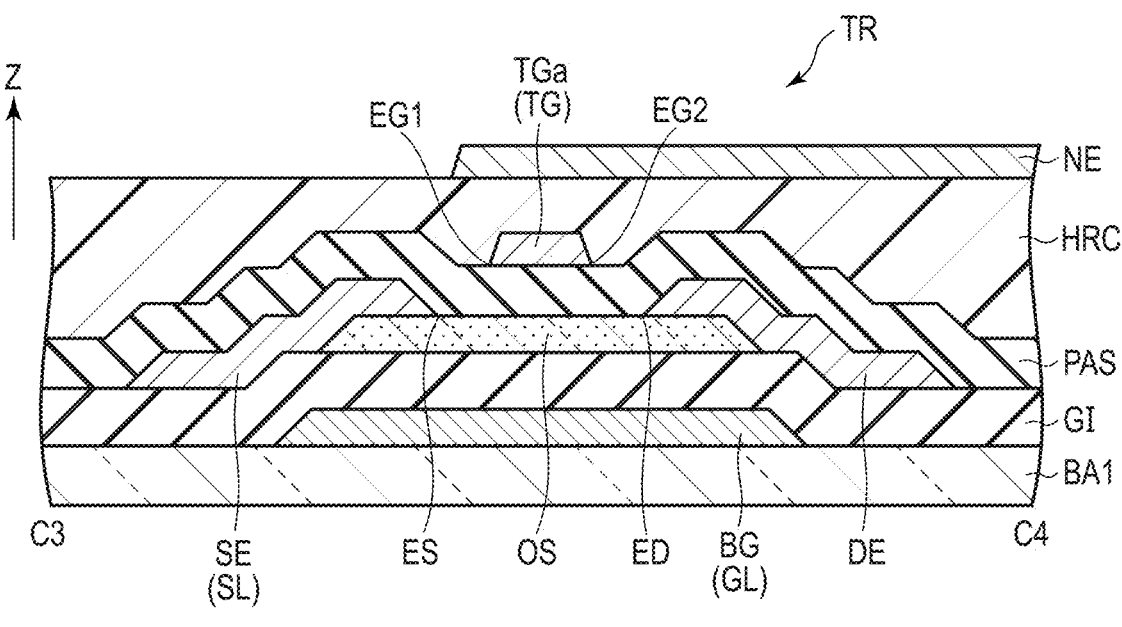
F I G. 9B

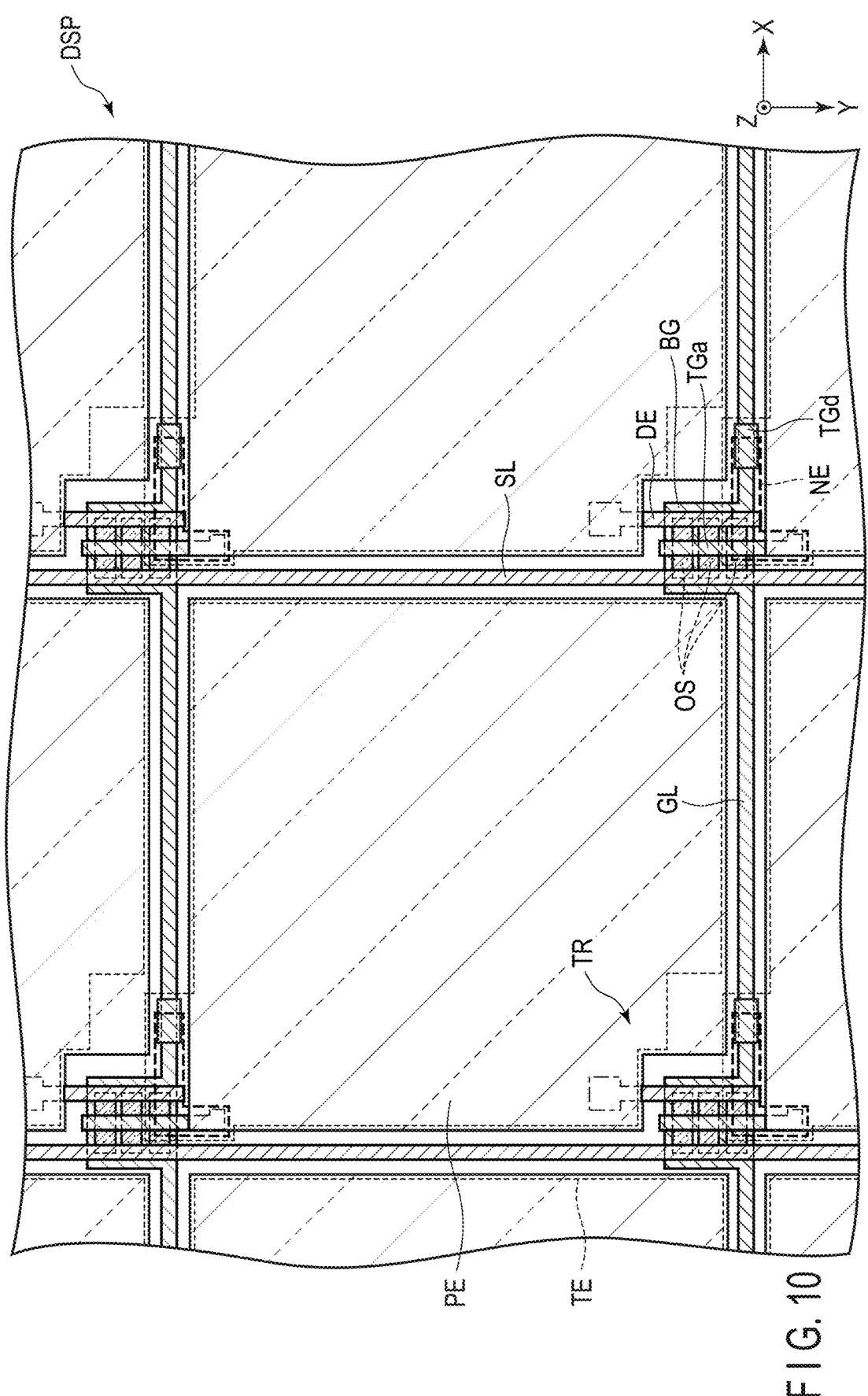
F I G. 10

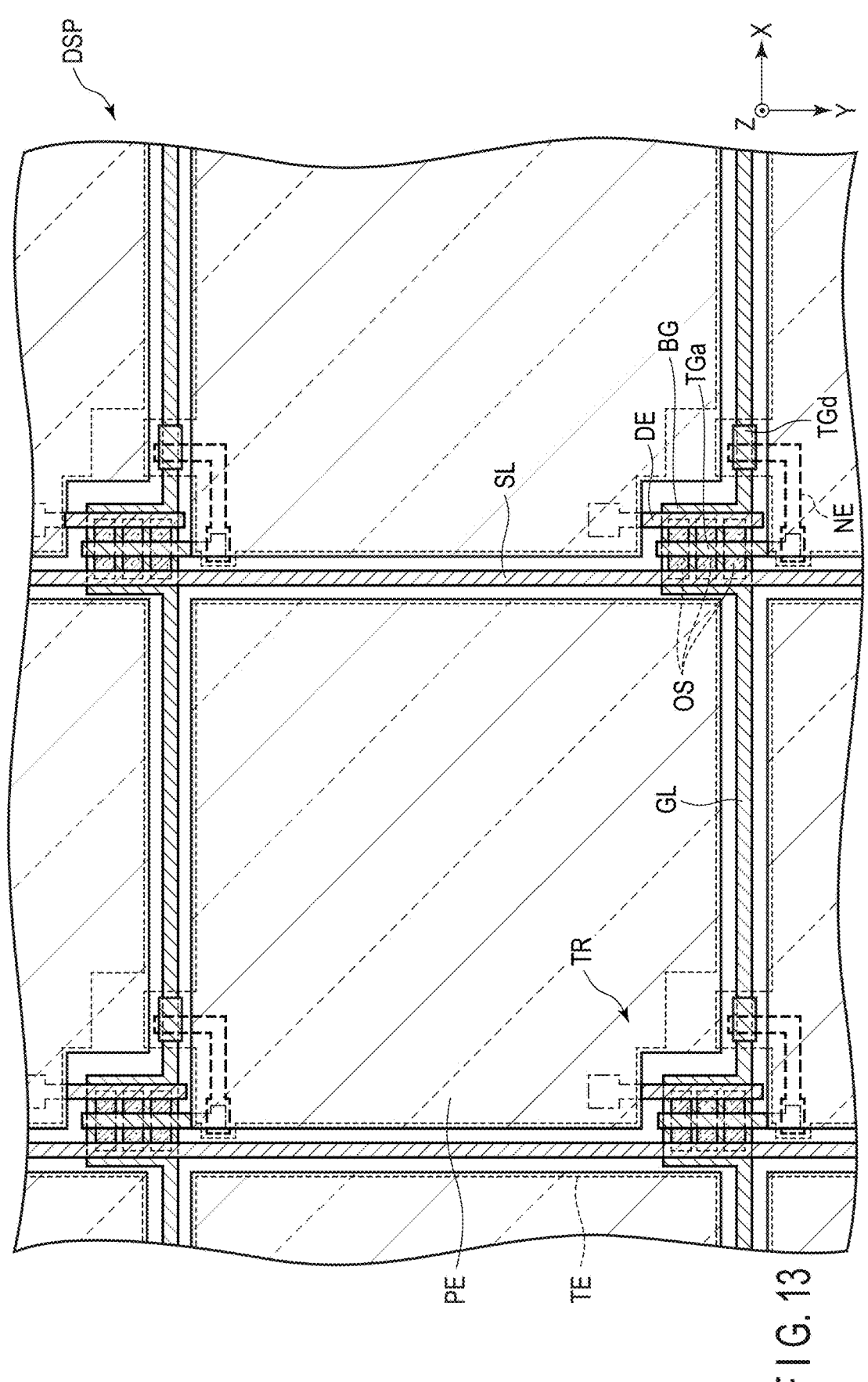
F I G. 13

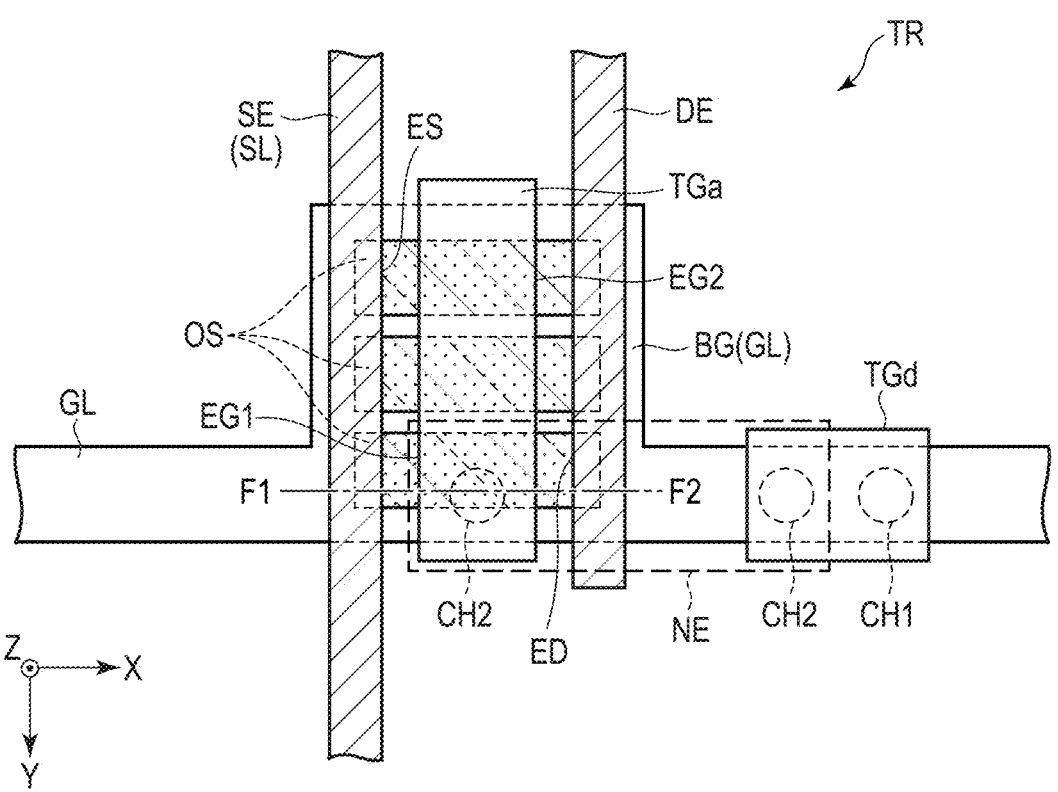
F I G. 14

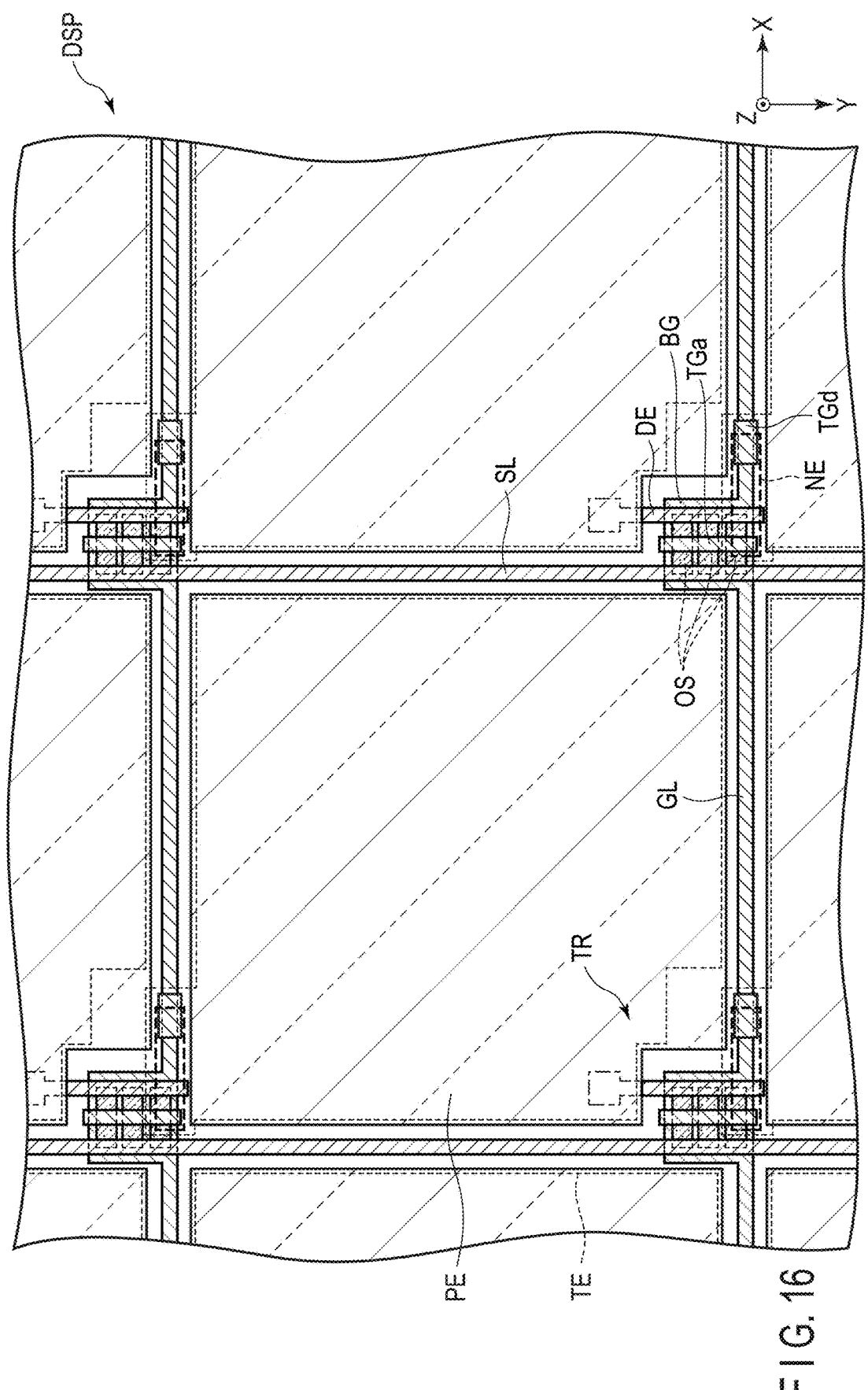
F I G. 16

SEMICONDUCTOR DEVICE AND DISPLAY DEVICE

CROSS-REFERENCE TO RELATED APPLICATIONS

This application is based upon and claims the benefit of priority from Japanese Patent Application No. 2022-006547, filed Jan. 19, 2022, the entire contents of which are incorporated herein by reference.

FIELD

Embodiments described herein relate generally to a semiconductor device and a display device.

BACKGROUND

In display devices, a technique in which a transistor comprising an oxide semiconductor is provided in the pixel circuit of a display area has been developed.

BRIEF DESCRIPTION OF THE DRAWINGS

FIG. 1 is an exploded perspective view showing an example of the general configuration of a display device according to embodiment 1.

FIG. 7 is a plan view showing an example of the general configuration of the display device according to embodiment 1.

FIG. 9A is a cross-sectional view of the transistor along the line C1-C2 shown in FIG. 8.

FIG. 9B is a cross-sectional view of the transistor along the line C3-C4 shown in FIG. 8.

FIG. 10 is a plan view showing an example of the general configuration of a display device according to embodiment 2.

FIG. 13 is a plan view showing an example of the general configuration of the display device according to embodiment 2.

FIG. 14 is a plan view showing an example of the general configuration of the transistor according to embodiment 2.

FIG. 16 is a plan view showing an example of the general configuration of the display device according to embodiment 2.

DETAILED DESCRIPTION

Figure 2:
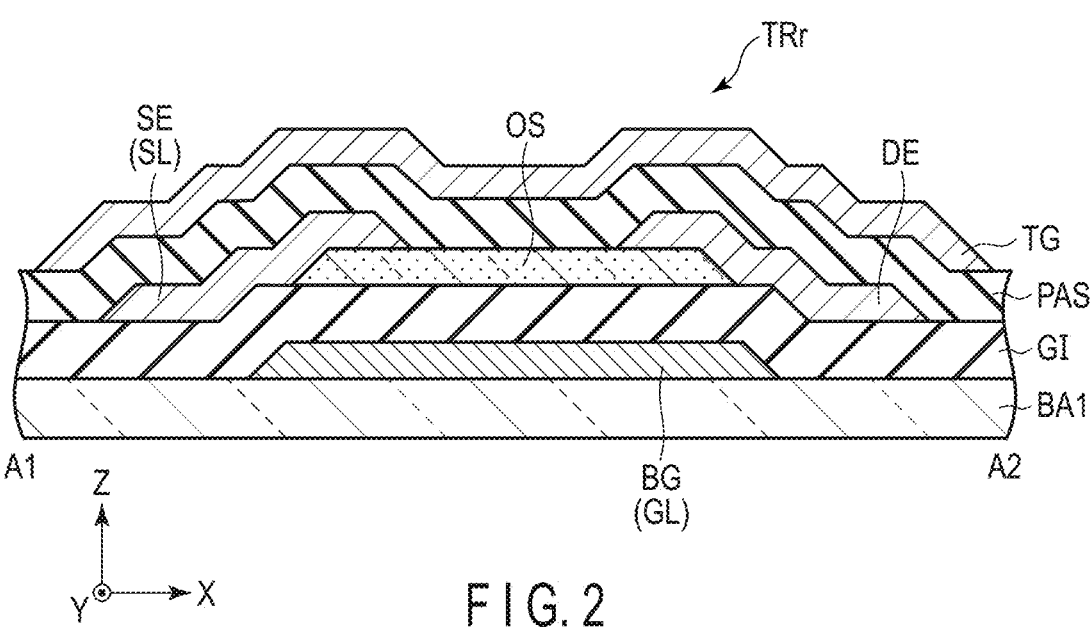
FIG. 2 is a cross-sectional view showing an example of the general configuration of a transistor according to a comparative example.

In general, according to one embodiment, a semiconductor device comprises
a first gate electrode formed integrally with a scanning line;
an oxide semiconductor layer;
first and second signal lines which are in contact with the oxide semiconductor layer; and
a second gate electrode provided so as to face the first gate electrode across the oxide semiconductor layer therebetween, and connected to the first gate electrode, wherein
the second gate electrode is provided between the first signal line and the second signal line and does not overlap the first signal line or the second signal line.

According to another embodiment, a semiconductor device comprises
a first gate electrode formed integrally with a scanning line;
an oxide semiconductor layer;
first and second signal lines which are in contact with the oxide semiconductor layer; and
a second gate electrode provided so as to face the first gate electrode across the oxide semiconductor layer therebetween and connected to the first gate electrode, wherein
the second gate electrode is provided between the first signal line and the second signal line and does not overlap the first signal line or the second signal line, and
the second gate electrode includes a first section, a second section, and a connection electrode provided in a layer different from a layer of the first section and the second section.

Embodiments described herein aim to provide a semiconductor device in which the yield has been improved, and a display device comprising the semiconductor device.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

The embodiments described in this specification are not general and explain the same or corresponding special technical features of the present invention. This specification explains the details of a semiconductor device and a display device according to each embodiment with reference to the accompanying drawings.

In the embodiments, a first direction X, a second direction Y and a third direction Z are perpendicular to each other. However, they may intersect each other at an angle other than 90 degrees. The third direction Z is defined as an upward direction or a direction toward an upper side. The opposite direction of the third direction Z is defined as a downward direction or a direction toward a lower side. The first direction X, the second direction Y and the third direction Z are also referred to as an X direction, a Y direction and a Z direction, respectively.

When this specification uses the phrases "a second member above a first member" and "a second member under a first member", the second member may be in contact with the first member, or may be spaced apart from the first member. In the latter case, a third member may be interposed between the first member and the second member. When this specification uses the phases "a second member on a first member" and "a second member directly under a first member", the second member is in contact with the first member.

It is assumed that an observation position for observing a display device is on the tip side of the arrow of the third direction Z. When the X-Y plane defined by the first direction X and the second direction Y is viewed at the observation position, the appearance is referred to as a plan view. When the section of the display device in the X-Z plane defined by the first direction X and the third direction Z or in the Y-Z plane defined by the second direction Y and the third direction Z is viewed, the appearance is referred to as a cross-sectional view.

Embodiment 1

FIG. 1 is an exploded perspective view showing an example of the general configuration of a display device according to the present embodiment. The display device DSP comprises an illumination device ILD and a display panel PNL.

The illumination device ILD may comprise a plurality of light source elements, a light guide and an optical sheet although they are not shown. The illumination device ILD may be either a direct illumination device or a side-lit illumination device.

The display panel PNL comprises a substrate SUB1, a substrate SUB2 and a liquid crystal layer (not shown) held between the substrate SUB1 and the substrate SUB2. In the overlapping area of the substrates SUB1 and SUB2, a display area DA and a non-display area NDA are provided. The display area DA comprises a plurality of pixels PX, a plurality of signal lines (source lines) SL and a plurality of scanning lines (gate lines) GL. The pixels PX are provided at the respective intersections of the signal lines SL and the scanning lines GL. A signal line drive circuit (source driver) SD connected to the signal lines SL and a scanning line drive circuit (gate driver) GD connected to the scanning lines GL are provided in the non-display area NDA.

Each pixel PX comprises a transistor TR and a liquid crystal element LCM.

In the substrate SUB1, an area which does not overlap the substrate SUB2 is defined as an end portion EX. The end portion EX comprises a flexible wiring board FPC connected to the signal lines SL and the scanning lines GL, and a driver element DRV. The driver element DRV is electri-cally connected to the signal lines SL and the scanning lines GL via the flexible wiring board FPC and inputs a drive signal to the lines.

Figure 3:
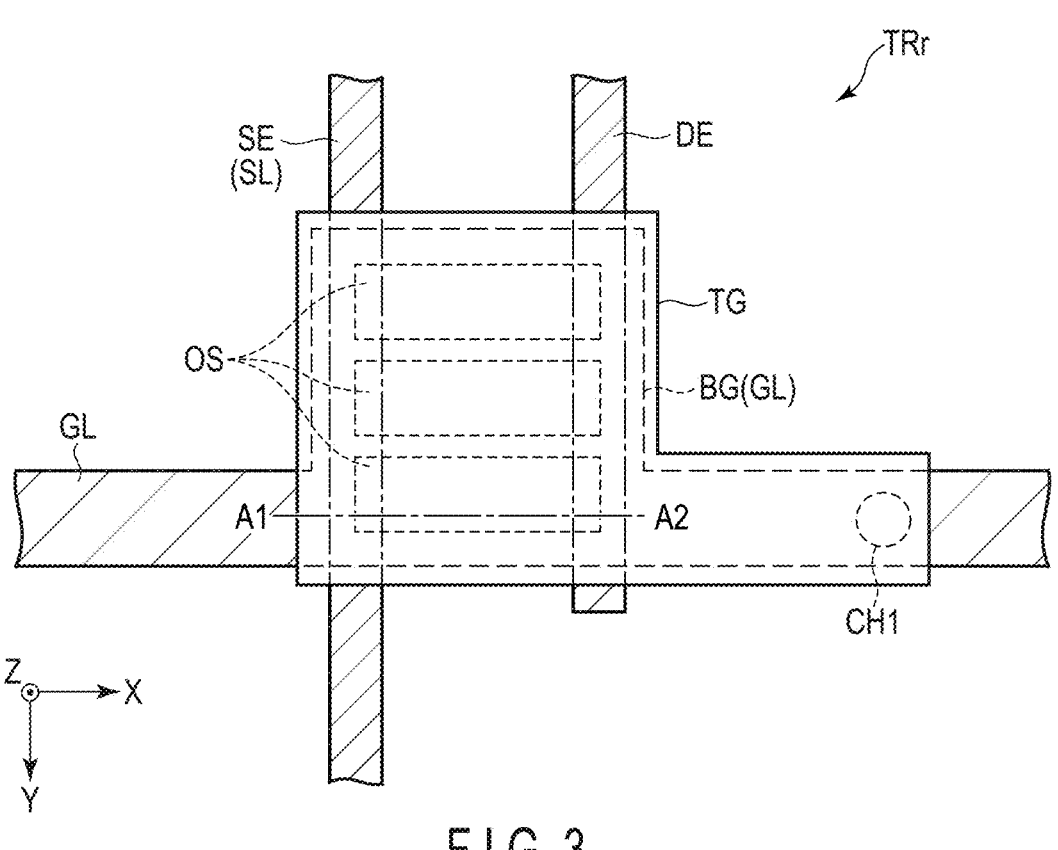
FIG. 3 is a plan view of the transistor shown in FIG. 2.

FIG. 2 is a cross-sectional view showing an example of the general configuration of a transistor according to a comparative example. FIG. 3 is a plan view of the transistor shown in FIG. 2. The cross-sectional view of the transistor along the line A1-A2 shown in FIG. 3 is FIG. 2.

The transistor TRr is provided on a base material BA1. The transistor TRr comprises a gate electrode BG, an oxide semiconductor layer OS, an insulating layer GI, a source electrode SE, a drain electrode DE, an insulating layer PAS and a gate electrode TG. The gate electrodes BG and TG are also called a bottom gate and a top gate, respectively. Alternatively, the gate electrodes BG and TG may be called a first gate electrode and a second gate electrode, respec-tively. An insulating layer may be provided between the base material BA1 and the gate electrode BG.

The base material BA1 is formed of glass or resin. For the resin, for example, polyimide resin or acrylic resin may be used.

The gate electrode BG may be formed of a metal material, for example, a metal film comprising a single-layer struc-ture, or a stacked film of a plurality of metal films. Specifi-cally, for example, the gate electrode BG may be formed by using a molybdenum tungsten alloy (MoW) film or a stacked film in which an aluminum alloy film is interposed between titanium films. The gate electrode BG is formed integrally with a scanning line GL.

The insulating layer GI is provided so as to cover the gate electrode BG and the base material BA1. The insulating layer GI consists of, for example, a single layer of silicon oxide or silicon nitride, or a stacked layer of them. For the insulating layer GI, an inorganic material containing oxygen such as silicon oxide is more desirable. The insulating layer GI may have a shielding function against impurities from glass, etc.

The oxide semiconductor layer OS is provided above the gate electrode BG across the intervening insulating layer GI. The oxide semiconductor layer OS is formed of indium gallium zinc oxide (IGZO), indium tin zinc oxide (ITZO), zinc oxide nitride (ZnON), indium gallium oxide (IGO), etc. The transistor TRr can be called a semiconductor device in which the oxide semiconductor layer OS is an active layer.

The source electrode SE and the drain electrode are provided on the insulating layer GI. Each of the source electrode SE and the drain electrode DE is directly in contact with the oxide semiconductor layer OS. Of the oxide semi-conductor layer OS, the areas which are in contact with the source electrode SE and the drain electrode DE are called a source area and a drain area, respectively. The source electrode SE and the drain electrode DE are formed of, for example, a stacked film in which an aluminum alloy layer is held between titanium films (a stacked film of titanium/aluminum/titanium [Ti/Al/Ti]). The source electrode SE is formed integrally with a signal line SL. The signal line SL and the source electrode SE may be collectively called a first signal line. The drain electrode DE may be called a second signal line.

The insulating layer PAS is provided so as to cover the insulating layer GI, the oxide semiconductor layer OS, the source electrode SE and the drain electrode DE. The insu-lating layer PAS may be formed of the same material as the insulating layer GI.

The gate electrode TG is provided on the insulating layer PAS so as to face the oxide semiconductor layer OS. The gate electrode TG may be formed of a metal material which is a light-shielding conductive material, for example, a metal film comprising a single-layer structure, or a stacked film of a plurality of metal films. Specifically, for example, the gate electrode TG may be formed by using a molybdenum tungsten alloy (MoW) film or a stacked film in which an aluminum alloy film is interposed between titanium films.

The oxide semiconductor layer OS is provided between the gate electrodes BG and TG. In other words, the gate electrode TG faces the gate electrode BG with the intervening oxide semiconductor layer OS therebetween. The insulating layer PAS is provided between the gate electrode TG and the oxide semiconductor layer OS. The insulating layer GI is provided between the gate electrode BG and the oxide semiconductor layer OS.

The gate electrode TG is connected to the scanning line GL (gate electrode BG) via a contact hole CH1 provided in the insulating layers GI and PAS. In other words, the same gate voltage is applied to the gate electrodes TG and BG.

By providing the gate electrode TG in addition to the gate electrode BG, the transistor characteristics of the transistor TRr is stabilized. However, if the source electrode SE overlaps the gate electrode TG, and the drain electrode DE overlaps the gate electrode TG, a short circuit easily occurs between them. In particular, in the third direction Z, an end portion of the source electrode SE overlapping the oxide semiconductor layer OS, and an end portion of the drain electrode overlapping the oxide semiconductor layer OS, are adjacent to the gate electrode TG. Thus, a short circuit may be easily caused. If a short circuit occurs between these electrodes, the yield of the transistor TRr is reduced.

In the present embodiment, as seen in plan view, the source electrode SE does not overlap the gate electrode TG, and further, the drain electrode DE does not overlap the gate electrode TG. A gap is defined between the end portion of the source electrode SE and the end portion of the gate electrode TG and between the drain electrode DE and the gate electrode TG. This configuration prevents a short circuit between the source electrode SE and the gate electrode TG and between the drain electrode DE and the gate electrode TG. In this way, the yield of the transistor can be improved.

Figure 4:
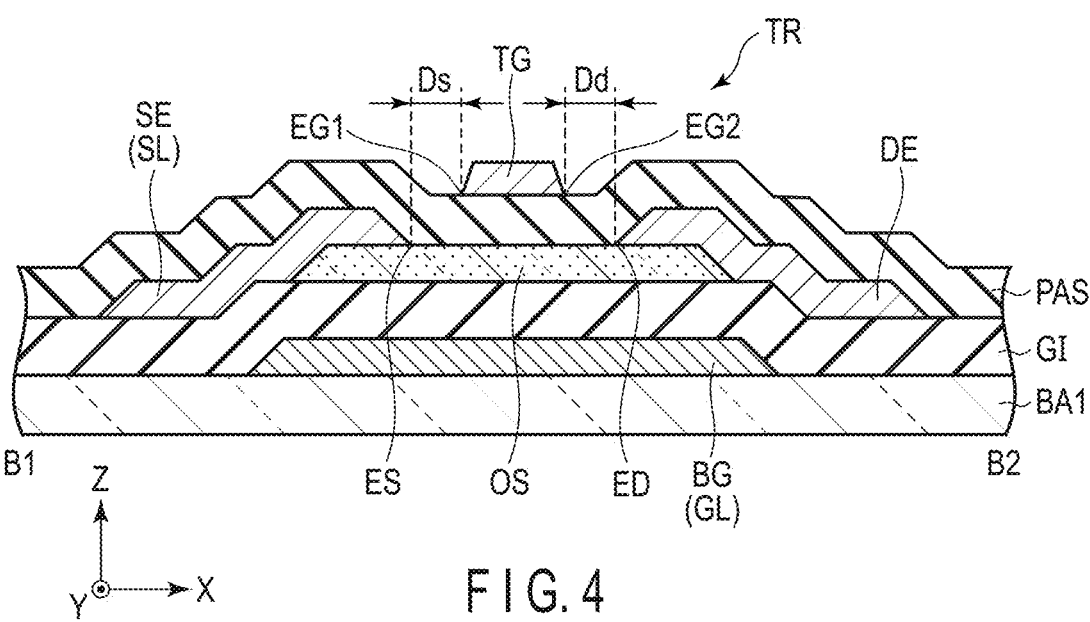
FIG. 4 is a cross-sectional view showing an example of the general configuration of a transistor according to embodiment 1.
Figure 5:
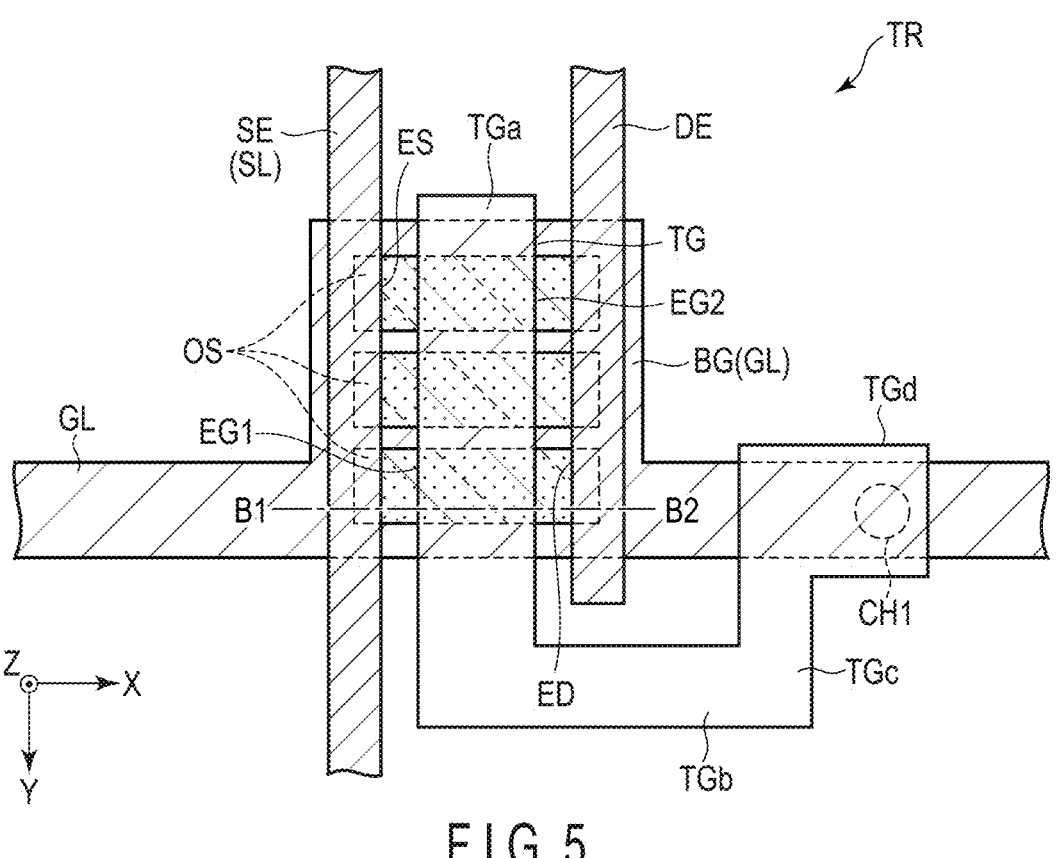
FIG. 5 is a plan view of the transistor shown in FIG. 4.

FIG. 4 is a cross-sectional view showing an example of the general configuration of the transistor according to the present embodiment. FIG. 5 is a plan view of the transistor shown in FIG. 4. The cross-sectional view of the transistor along the line B1-B2 shown in FIG. 5 is FIG. 4.

The transistor TR shown in FIG. 4 and FIG. 5 is different from the transistor TRr of the comparative example in terms of the shape and layout of the gate electrode TG. The gate electrode TG of the transistor TR does not overlap a source electrode SE (signal line SL) or a drain electrode DE as seen in plan view. The end portion of the source electrode SE and the end portion of the drain electrode DE, which are adjacent to the gate electrode TG are defined as end portions ES and ED, respectively. The end portion of the gate electrode TG adjacent to the source electrode SE, and the end portion of the gate electrode TG adjacent to the drain electrode DE are defined as end portions EG1 and EG2, respectively. Gaps Ds and Dd are defined between the end portions ES and EG1 and between the end portions ED and EG2, respectively.

In the present embodiment, the gaps Ds and Dd are defined between the gate electrode TG and the source electrode SE and between the gate electrode TG and the drain electrode DE. This configuration can prevent a short circuit between these electrodes. In this way, the yield of the transistor TR can be improved, and the reliability of the display device DSP can be improved.

To avoid an overlap between the gate electrode TG and the drain electrode DE, the gate electrode TG is provided around the drain electrode DE from the outside of the drain electrode DE. The gate electrode TG comprises a section TGa extending in the second direction Y, a section TGb extending in the first direction X, a section TGc extending in the second direction Y and a section TGd extending in the first direction X and overlapping the scanning line GL. The sections TGa, TGb, TGc and TGd shown in FIG. 5 are integrally formed and constitute the gate electrode TG.

The section TGa overlaps a gate electrode BG and three oxide semiconductor layers OS. The sections TGa, TGb and TGc are provided so as to surround the drain electrode DE. The section TGd overlaps the scanning line GL. The section TGd is connected to the scanning line GL via a contact hole CH1 provided in insulating layers PAS and GI.

As shown in FIG. 5, the scanning line GL extends in the first direction X. Of the scanning line GL, the area which protrudes in a direction parallel to the second direction Y is the gate electrode BG. The oxide semiconductor layers OS are provided so as to overlap the gate electrode BG.

In the transistor TR shown in FIG. 5, three oxide semiconductor layers OS are provided. The number of oxide semiconductor layers OS is not limited to this example. Only one oxide semiconductor layer OS may be provided. Alternatively, a plurality of, in other words, two or more oxide semiconductor layers OS may be provided. The transistor TR can obtain redundancy by comprising a plurality of oxide semiconductor layers OS. When the channel width is increased, the resistance of the transistor TR to current is increased. However, when the number of oxide semiconductor layers OS is increased, the area of the transistor TR is increased, and thus, the definition may be decreased. The number of oxide semiconductor layers OS may be appropriately determined in consideration of the definition of the display device DSP, the stability of the transistor TR, etc.

Figure 6:
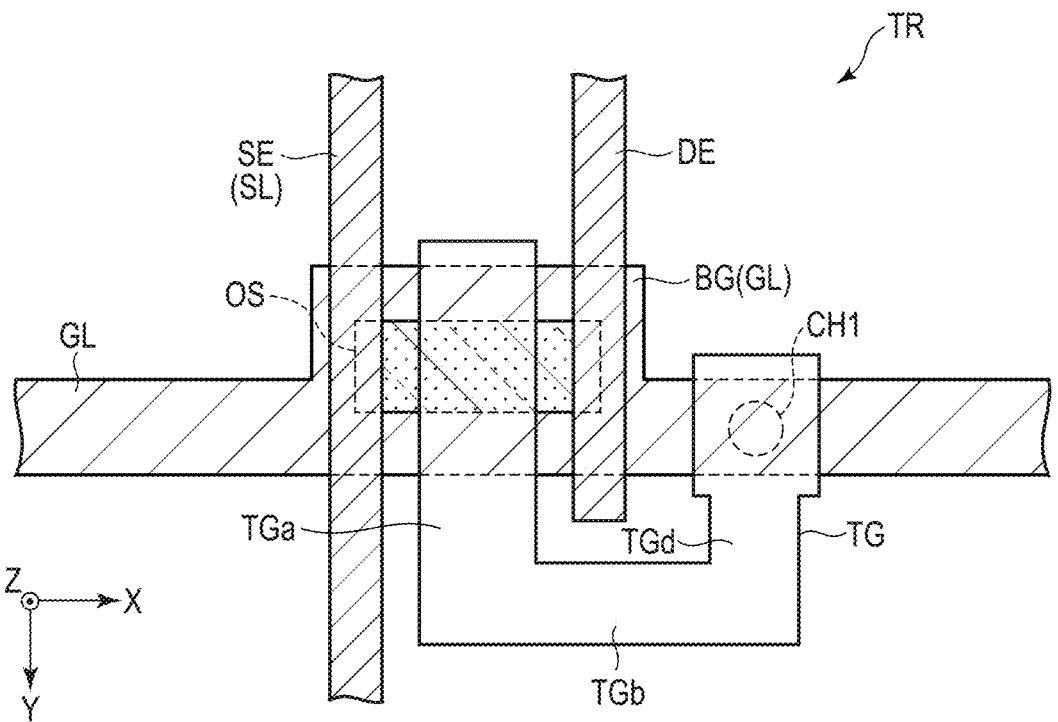
FIG. 6 is a plan view showing an example of the general configuration of a transistor comprising an oxide semiconductor layer.

FIG. 6 is a plan view showing an example of the general configuration of a transistor comprising an oxide semiconductor layer. As shown in FIG. 6, as only one oxide semiconductor layer OS is provided, the area of the transistor TR can be reduced.

FIG. 7 is a plan view showing an example of the general configuration of the display device according to the present embodiment. The display device DSP shown in FIG. 7 comprises a plurality of pixels PX. A transistor TR, a pixel electrode PE and a transparent electrode TE are provided in each of the pixels PX.

The pixel electrode PE is provided inside the area surrounded by two signal lines SL and two scanning lines GL. The pixel electrode PE is connected to the drain electrode DE of the transistor TR. The liquid crystal layer (not shown) provided between the substrate SUB1 and the substrate SUB2 is driven by an electric field generated between the pixel electrode PE provided in the substrate SUB1 and the counter-electrode (not shown) provided in the substrate SUB2.

The transparent electrode TE is provided so as to cover the signal lines SL, the scanning lines GL and the transistor TR. As the transparent electrode TE overlaps the signal lines SL and the scanning lines GL, an electric field between the electrode and the counter-electrode is blocked. This configuration can prevent an electric field from affecting the liquid crystal layer in an unnecessary area, thereby preventing the liquid crystal layer from operating in an undesired manner.

An end portion of the transparent electrode TE overlaps an end portion of the pixel electrode PE. In this overlapping area of the transparent electrode TE and the pixel electrode PE, retention capacitance is formed. The transparent electrode TE is connected to a common line (not shown). Through the common line, a predetermined voltage is applied.

Thus, the transparent electrode TE comprises a function of forming capacitance in each pixel PX and a shielding function against the electric field of the signal lines SL and the scanning lines GL.

The pixel electrode PE and the transparent electrode TE are formed of a transparent conductive material. For the transparent conductive material, for example, indium tin oxide (ITO) or indium zinc oxide (IZO) is used.

As the transparent electrode TE is formed of a transparent conductive material as described above, the above effect can be obtained without decreasing the aperture ratio of the pixels PX.

The transistor TR of the present embodiment comprises a configuration in which the gate electrode TG (top gate) does not overlap the source electrode SE or the drain electrode DE as seen in plan view. This configuration can prevent a short circuit between these electrodes. It is possible to improve the yield of the transistor TR and improve the reliability of the display device DSP.

Embodiment 2

Figure 8:
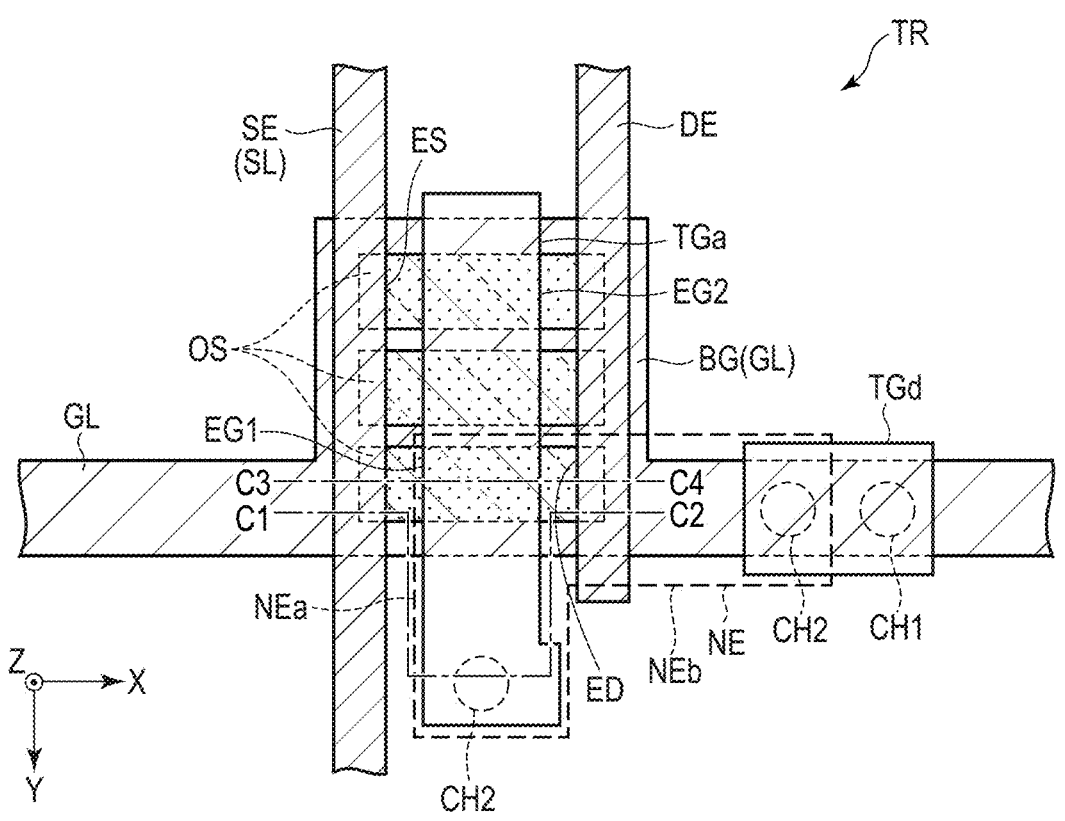
FIG. 8 is a plan view showing an example of the general configuration of a transistor according to embodiment 2.

FIG. 8 is a plan view showing a display device according to the present embodiment. The configuration example shown in FIG. 8 is different from the configuration example shown in FIG. 5 in respect that part of a gate electrode TG is replaced by another electrode layer.

FIG. 8 is a plan view showing an example of the general configuration of a transistor according to the present embodiment. FIG. 9A is a cross-sectional view of the transistor along the line C1-C2 shown in FIG. 8. FIG. 9B is a cross-sectional view of the transistor along the line C3-C4 shown in FIG. 8.

By the configuration shown in FIG. 5, a short circuit between the gate electrode TG and the source electrode SE and between the gate electrode TG and the drain electrode DE can be prevented. However, in the configuration in which the gate electrode TG does not overlap the drain electrode DE, the gate electrode TG needs to be provided around the drain electrode DE. Thus, the area of the gate electrode TG is increased. When the area in which the gate electrode TG overlaps the aperture portion of the pixel PX is increased, the aperture ratio may be decreased.

In the transistor TR shown in FIG. 8, the gate electrode TG consists of sections TGa and TGd and a connection electrode NE. The sections TGa and TGd are formed of, for example, a metal material which is a light-shielding conductive material. The connection electrode NE is formed of a metal material which is a light-shielding conductive material provided in a layer different from that of the sections TGa and TGd. The sections TGa and TGd and the connection electrode NE may be formed of the same material.

The connection electrode NE comprises a section NEa extending in the second direction Y and a section NEb extending in the first direction X. The section NEa overlaps the section TGa as seen in plan view. The insulating layer HRC shown in FIG. 9A and FIG. 9B is provided between the sections NEa and TGa. The section NEa is connected to the section TGa via a contact hole CH2 provided in the insulating layer HRC. The area in which the sections NEa and TGa are connected to each other does not overlap oxide semiconductor layers OS.

The area in which the sections NEa and TGa are connected to each other is located in an end portion of the section TGa. The other end portion of the section TGa extends in the opposite direction of the second direction Y and overlaps the oxide semiconductor layers OS. This end portion protrudes further in the opposite direction of the second direction Y from the area in which the oxide semiconductor layers OS are provided. However, the portion which protrudes from the area in which the oxide semiconductor layers OS are provided should be as small as it can be made. If this protruding portion is large, parasitic capacitance is also increased.

The section NEb overlaps a scanning line GL and the section TGd as seen in plan view. The section NEb is connected to the section TGd via the contact hole CH2 provided in the insulating layer HRC. The section TGd is connected to the scanning line GL via a contact hole CH1 provided in insulating layers GI and PAS.

The sections NEa and NEb overlap the light-shielding scanning line GL and sections TGa and TGd. Thus, the section NEa or NEb does not overlap the aperture portion. Thus, the gate electrode TG can be provided without decreasing the aperture ratio.

The insulating layer HRC described above is provided so as to cover the insulating layer PAS and the gate electrode TG as shown in FIG. 9A and FIG. 9B. The connection electrode NE is provided on the insulating layer HRC, and is connected to, as described above, the gate electrode TG via the contact hole CH2 provided in the insulating layer HRC. The insulating layer HRC is formed of an organic insulating material such as polyimide or acrylic resin.

FIG. 10 is a plan view showing an example of the general configuration of the display device according to the present embodiment. As shown in FIG. 10, in the gate electrode TG, the area overlapping a pixel electrode PE is small. The gate electrode TG does not shield the aperture portion from light. Thus, the aperture ratio is not decreased.

In FIG. 10, a transparent electrode TE is provided so as not to overlap the connection electrode NE or the section TGa or TGd. The transparent electrode TE is provided in the area overlapping the scanning lines GL, signal lines SL and the transistor TR such that the area in which the connection electrode NE and the sections TGa and TGd are provided is excluded.

A predetermined voltage is applied to the transparent electrode TE through a common line (not shown). The connection electrode NE and the sections TGa and TGd are connected to, in other words, the gate electrode TG is connected to, a gate electrode BG. A gate voltage is applied to the gate electrodes BG and TG through the scanning line GL. Thus, if the transparent electrode TE overlaps the gate electrode TG, a short circuit occurs. For this reason, the transparent electrode TE is formed so as not to overlap the gate electrode TG (the connection electrode NE or the section TGa or TGd).

The present embodiment can prevent a short circuit between the gate electrode TG and a source electrode SE and between the gate electrode TG and a drain electrode DE. It is possible to improve the yield of the transistor TR and improve the reliability of the display device DSP.

Further, in the present embodiment, part of the gate electrode TG is formed in another electrode layer and overlaps the scanning line GL. By this configuration, a display device DSP having a high luminance can be obtained without decreasing the aperture ratio of each pixel PX.

Figure 11:
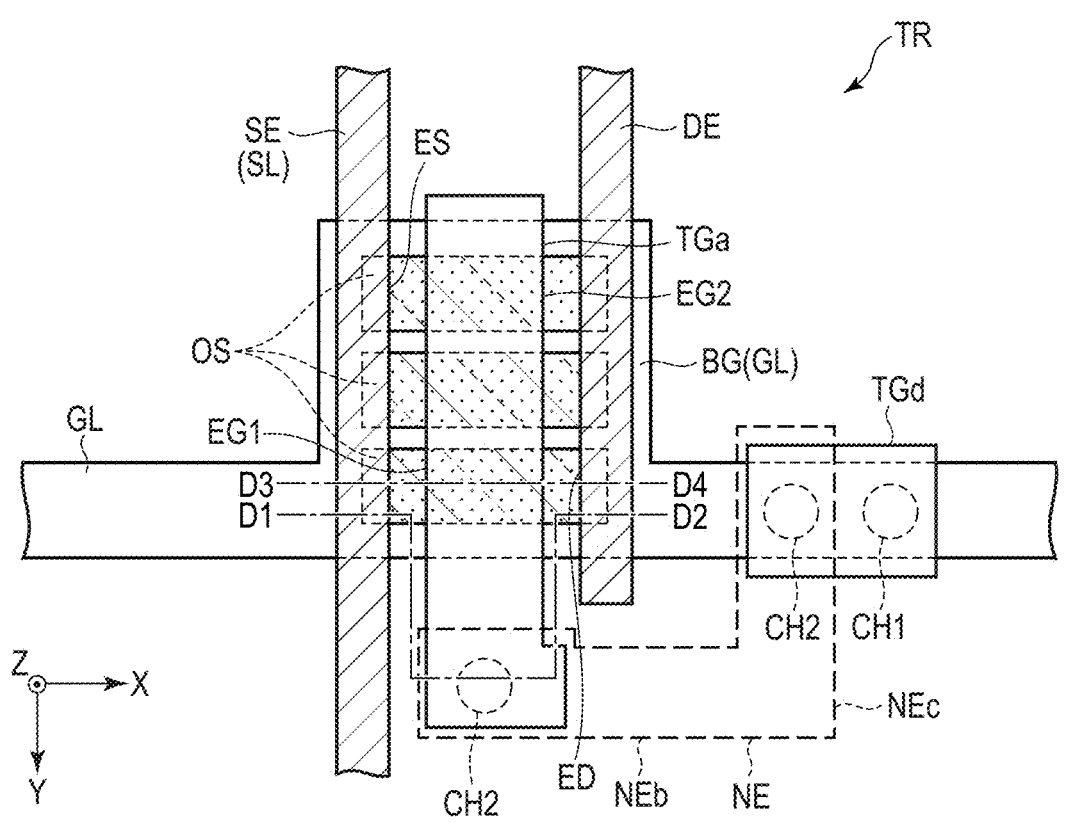
FIG. 11 is a plan view showing an example of the general configuration of the transistor according to embodiment 2.
Figure 12A:
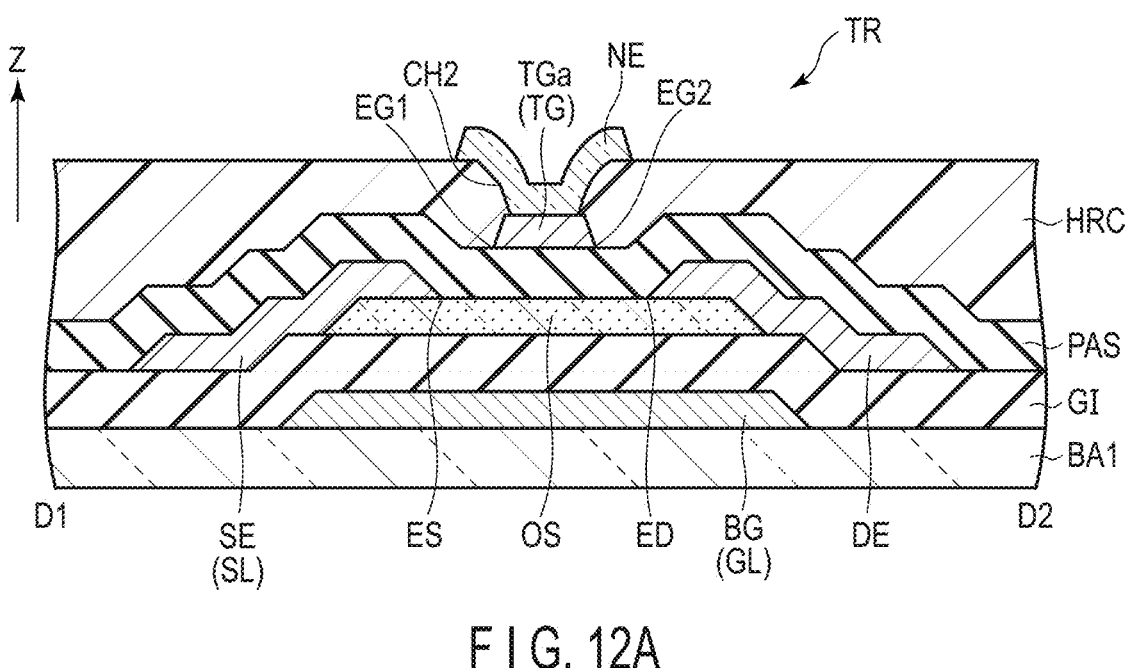
FIG. 12A is a cross-sectional view of the transistor along the line D1-D2 shown in FIG. 11.
Figure 12B:
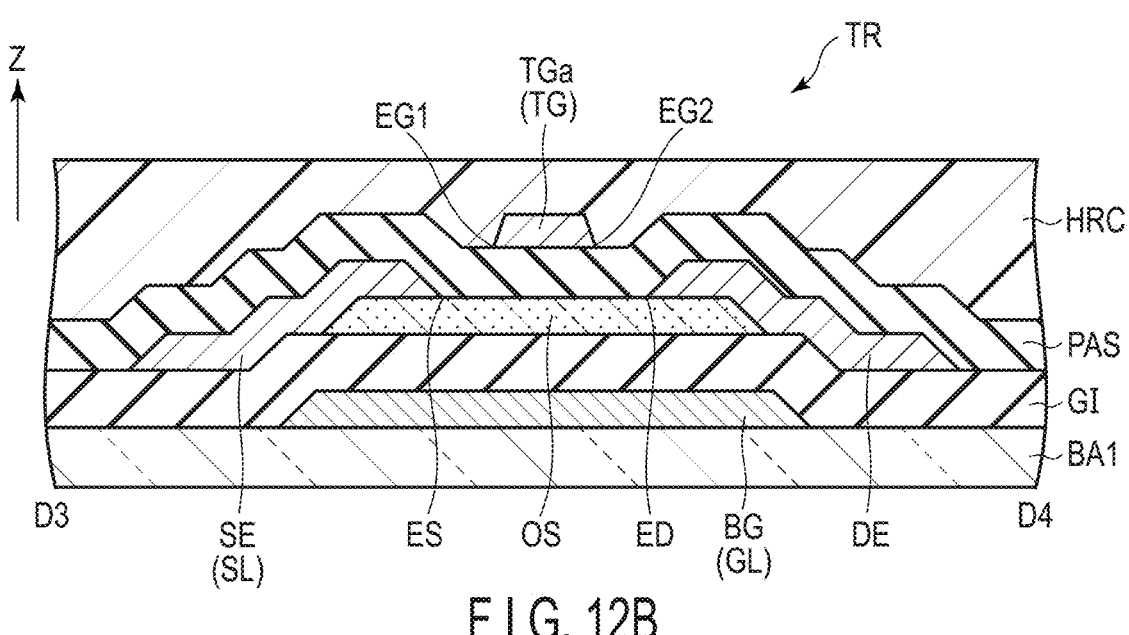
FIG. 12B is a cross-sectional view of the transistor along the line D3-D4 shown in FIG. 11.

FIG. 11 is a plan view showing an example of the general configuration of the transistor according to the present embodiment. FIG. 12A is a cross-sectional view of the transistor along the line D1-D2 shown in FIG. 11. FIG. 12B is a cross-sectional view of the transistor along the line D3-D4 shown in FIG. 11. The transistor TR shown in FIG. 11 is different from the configuration example shown in FIG. 8 in respect that part of the gate electrode TG is replaced by a transparent conductive material.

The connection electrode NE shown in FIG. 11 comprises the section NEb extending in the first direction X and a section NEc extending in the second direction Y. The connection electrode NE is formed of a transparent conductive material. For the transparent conductive material, the materials of the pixel electrode PE and the transparent electrode TE may be used.

The section NEb overlaps the section TGa as seen in plan view. The insulating layer HRC is provided between the sections NEb and TGa. The section NEb is connected to the section TGa via the contact hole CH2 provided in the insulating layer HRC.

The section NEc overlaps the section TGd. The section NEc is connected to the section TGd via the contact hole CH2 provided in the insulating layer HRC. The section TGd is connected to the scanning line GL via the contact hole CH1 provided in the insulating layers GI and PAS.

Since the connection electrode NE (the sections NEb and NEc) is formed of a transparent conductive material, the aperture ratio is not affected.

FIG. 13 is a plan view showing an example of the general configuration of the display device according to the present embodiment. As shown in FIG. 13, the connection electrode NE which is part of the gate electrode TG overlaps the pixel electrode PE. However, as described above, since the connection electrode NE is formed of a transparent conductive material, the aperture ratio is not decreased.

In FIG. 13, similarly, the transparent electrode TE is provided so as not to overlap the connection electrode NE or the section TGa or TGd.

The present embodiment can prevent a short circuit between the gate electrode TG and the source electrode SE and between the gate electrode TG and the drain electrode DE. It is possible to improve the yield of the transistor TR and improve the reliability of the display device DSP.

Further, in the present embodiment, part of the gate electrode TG is formed of another transparent conductive material and overlaps the scanning line GL. By this configuration, a display device DSP having a high luminance can be obtained without decreasing the aperture ratio of each pixel PX.

Configuration Example 1 of Embodiment 2

FIG. 14 is a plan view showing the display device according to this configuration example. The configuration example shown in FIG. 14 is different from the configuration example shown in FIG. 8 in respect that the connection area in which the section TGa and the connection electrode NE are connected to each other overlaps the oxide semiconductor layer OS.

Figure 15:
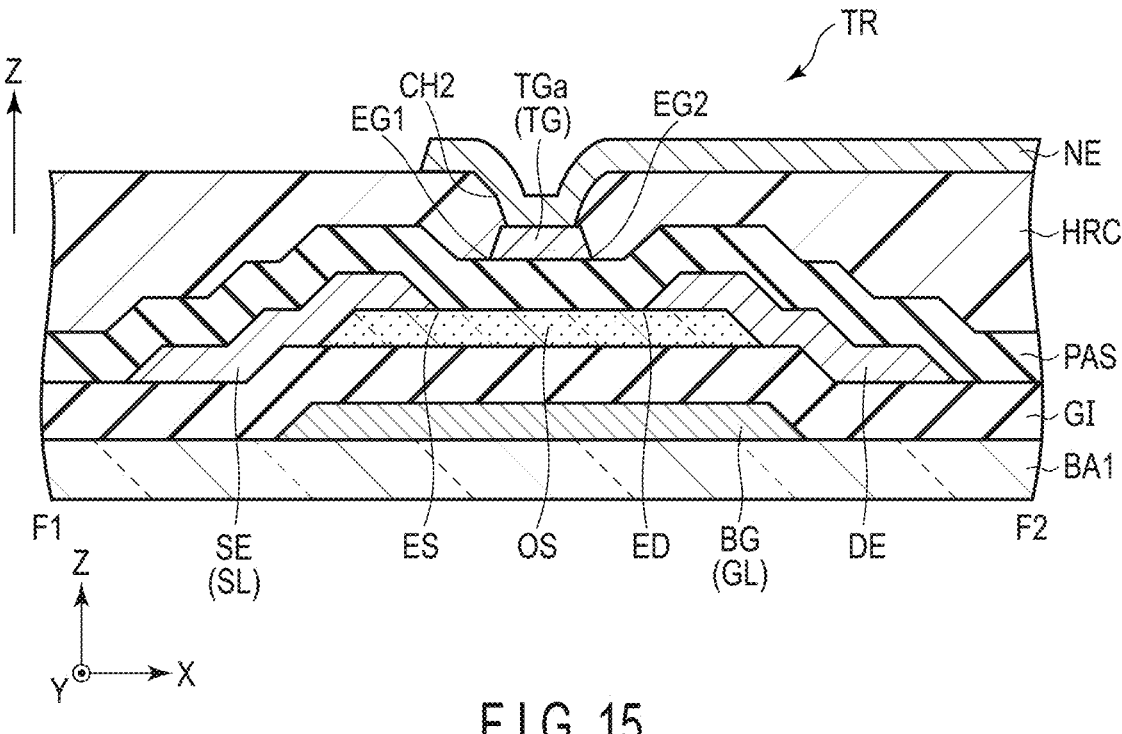
FIG. 15 is a cross-sectional view of the transistor along the line F1-F2 shown in FIG. 14.

FIG. 14 is a plan view showing an example of the general configuration of the transistor according to the present embodiment. FIG. 15 is a cross-sectional view of the transistor along the line F1-F2 shown in FIG. 14. FIG. 16 is a plan view showing an example of the general configuration of the display device according to the present embodiment.

The connection electrode NE is connected to the section TGa via the contact hole CH2 provided in the insulating layer HRC. The contact hole CH2 is provided so as to overlap the oxide semiconductor layer OS as seen in plan view. The connection electrode NE also overlaps the drain electrode DE as seen in plan view. However, the insulating layer HRC is provided between the connection electrode NE and the drain electrode DE in the third direction Z. Thus, electric interference does not easily occur between the drain electrode DE and the connection electrode NE.

The area in which the connection electrode NE and the section TGa are connected to each other, in other words, the area in which the contact hole CH2 is provided, requires a certain size. If this area is small, the radius of the lower part of the contact hole CH2 is small. Thus, the connection between the connection electrode NE and the section TGa filled into the contact hole CH2 may be defective. To prevent a defective connection, the radius of the lower part of the contact hole CH2 and the area of the section TGa relative to the radius of this lower part need to be increased.

When the distance between the source electrode SE (signal line SL) and the drain electrode DE is long, the area of the section TGa can be sufficiently assured. In this case, the connection area in which the connection electrode NE and the section TGa are connected to each other can overlap the oxide semiconductor layer OS (see FIG. 14 and FIG. 17 described later).

When the distance between the source electrode SE (signal line SL) and the drain electrode DE is short, as shown in FIG. 8 and FIG. 11, the area in which the connection electrode NE and the section TGa are connected to each other may be provided in an area which does not overlap the oxide semiconductor layers OS.

As shown in FIG. 14, the connection electrode NE overlaps the drain electrode DE and the scanning line GL as seen in plan view. The connection electrode NE may be formed without bypassing the drain electrode DE. Thus, the connection electrode NE can be formed so as to be small. When the connection electrode NE is small, the parasitic capacitance can be made less.

As shown in FIG. 16, the transparent electrode TE does not overlap the section TGa, the connection electrode NE or the section TGd. This configuration is adopted to prevent a short circuit between the transparent electrode TE and the gate electrode TG as described above.

Figure 17:
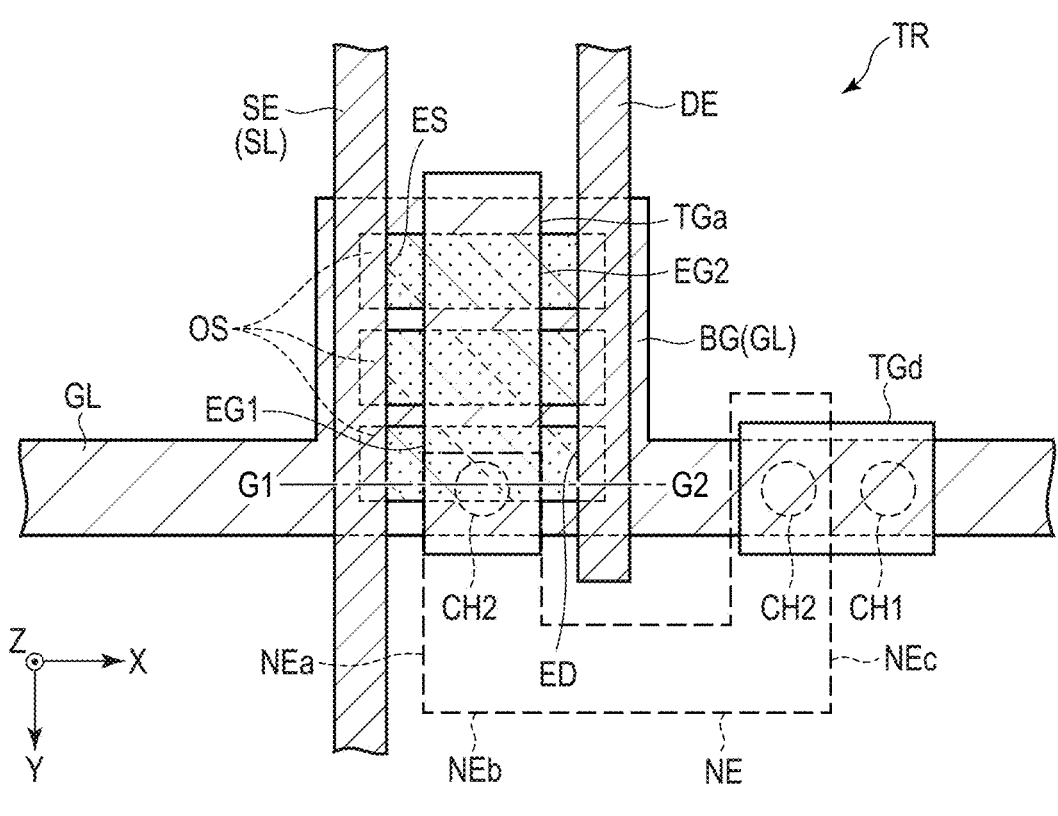
FIG. 17 is a plan view showing an example of the general configuration of the transistor according to embodiment 2.
Figure 18:
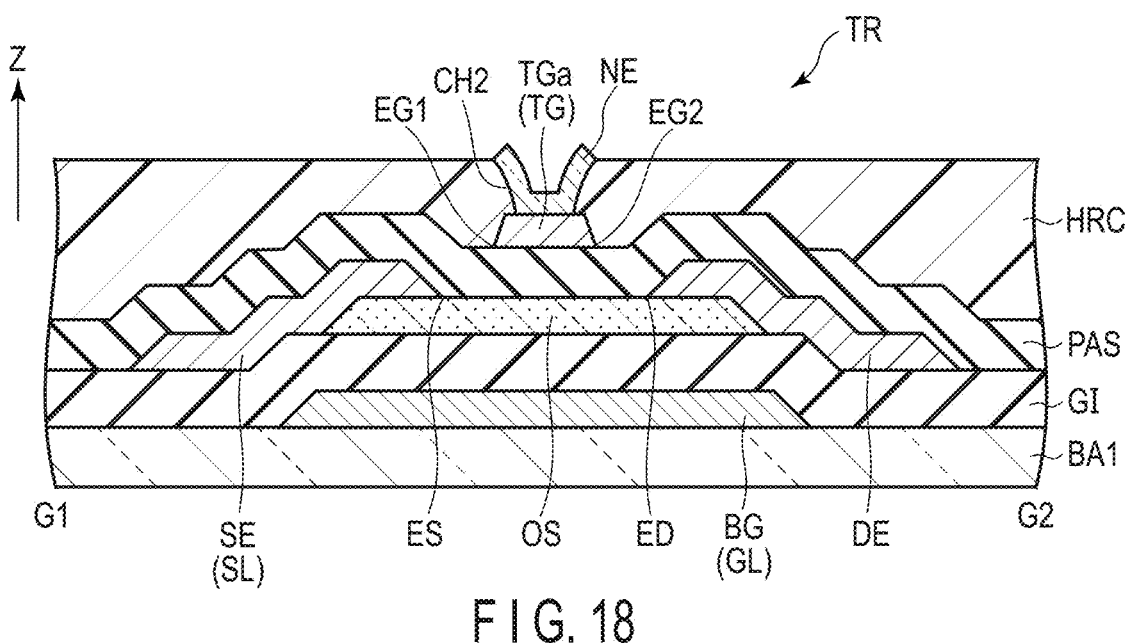
FIG. 18 is a cross-sectional view of the transistor along the line G1-G2 shown in FIG. 17.
Figure 19:
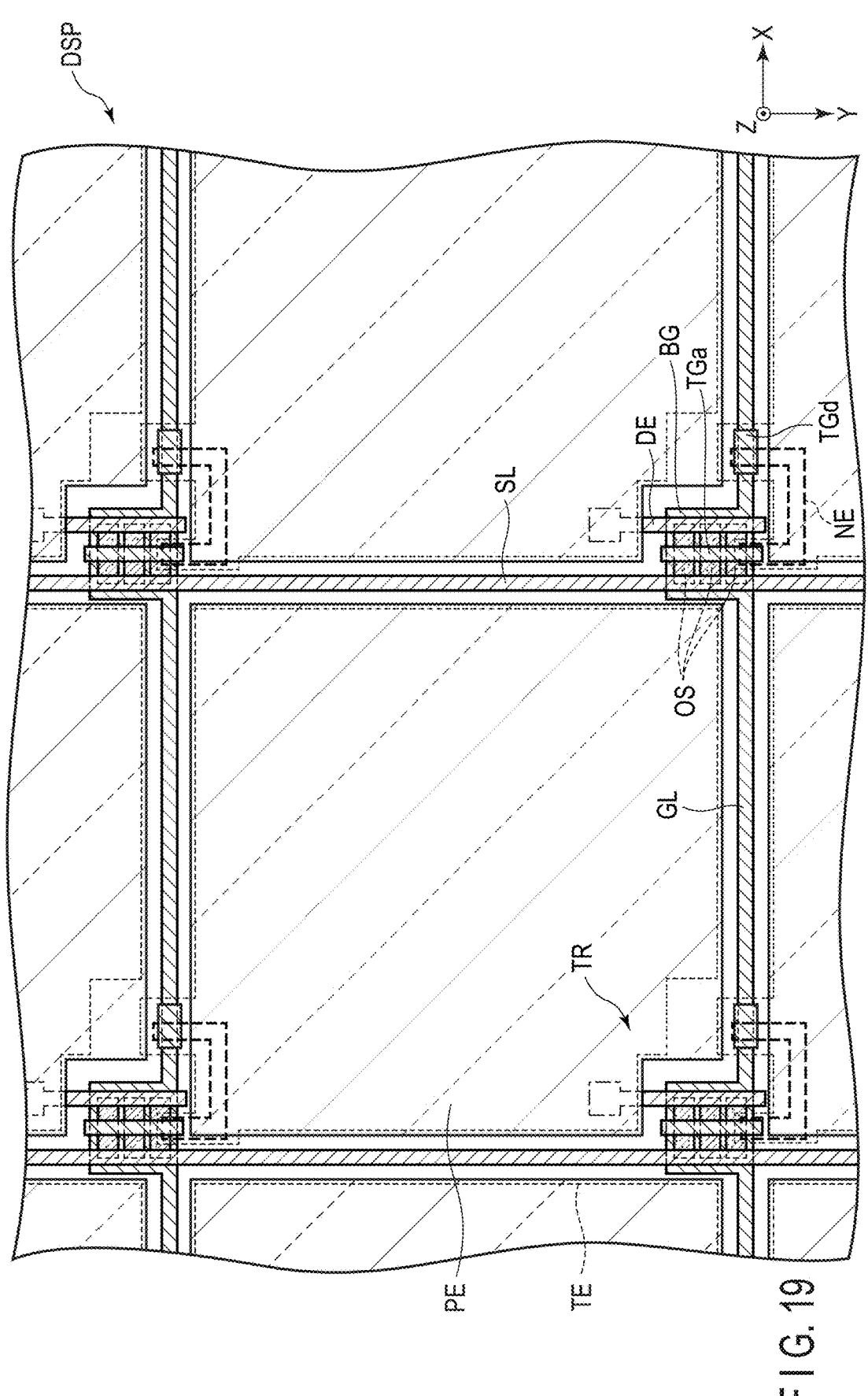
FIG. 19 is a plan view showing an example of the general configuration of the display device according to the present embodiment.

FIG. 17 is a plan view showing an example of the general configuration of the transistor according to the present embodiment. FIG. 18 is a cross-sectional view of the transistor along the line G1-G2 shown in FIG. 17. FIG. 19 is a plan view showing an example of the general configuration of the display device according to the present embodiment.

The configuration example shown in FIG. 17 is different from the configuration example shown in FIG. 14 in respect that the connection electrode NE is formed of a transparent conductive material.

The connection electrode NE comprises the section NEa extending in the second direction Y, the section NEb extending in the first direction X and the section NEc extending in the second direction Y. The section NEa is connected to the section TGa. The section NEc is connected to the section TGd.

In the transistor TR shown in FIG. 17, in a manner similar to that of FIG. 14, the area in which the connection electrode NE and the section TGa are connected to each other overlaps the oxide semiconductor layer OS. The connection electrode NE is formed of the transparent conductive material described above. Thus, even if the connection electrode NE overlaps the pixel electrode PE, the aperture ratio is not decreased.

The connection electrode NE shown in FIG. 17 does not overlap the drain electrode DE as seen in plan view and is provided around the drain electrode DE. The area which does not overlap the scanning line GL or the section TGa or TGd is transparent as described above. Thus, the aperture ratio is maintained.

In this configuration example, effects similar to those of embodiment 2 can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first gate electrode formed integrally with a scanning line;
a first insulating layer covering the first gate electrode;
an oxide semiconductor layer above the first gate electrode with the first insulating layer interposed therebetween;
a first signal line and a second signal line which are in direct contact with the oxide semiconductor layer, the first signal line being a conductive signal line in direct contact with a source region of the oxide semiconductor layer, the second signal line being a conductive signal line in direct contact with a drain region of the oxide semiconductor layer;
a second insulating layer entirely covering the oxide semiconductor layer, the first signal line, and the second signal line; and
a second gate electrode provided on the second insulating layer so as to face the first gate electrode across the oxide semiconductor layer therebetween, and connected to the first gate electrode, wherein
the second gate electrode is provided between the first signal line and the second signal line and does not overlap the first signal line or the second signal line.

2. The semiconductor device according to claim 1, wherein
the second gate electrode is formed of a light-shielding conductive material.

3. The semiconductor device according to claim 1, wherein the oxide semiconductor layer comprises a plurality of oxide semiconductor layers.

4. The semiconductor device according to claim 1, wherein the oxide semiconductor layer is a single oxide semiconductor layer.

5. A display device comprising:
a pixel;
the semiconductor device according to claim 1 and provided in the pixel, wherein the pixel is provided at an intersection of the first signal line and the scanning line;
a pixel electrode connected to the second signal line; and
a transparent electrode overlapping the scanning line and the first signal line.

6. The display device according to claim 5, wherein the transparent electrode does not overlap the second gate electrode.

7. A semiconductor device comprising:
a first gate electrode formed integrally with a scanning line;
a first insulating layer covering the first gate electrode;
an oxide semiconductor layer above the first gate electrode with the first insulating layer interposed therebetween;
a first signal line and a second signal line which are in direct contact with the oxide semiconductor layer, the first signal line being a conductive signal line in direct contact with a source region of the oxide semiconductor layer, the second signal line being a conductive signal line in direct contact with a drain region of the oxide semiconductor layer;
a second insulating layer entirely covering the oxide semiconductor layer, the first signal line, and the second signal line; and
a second gate electrode provided on the second insulating layer so as to face the first gate electrode across the oxide semiconductor layer therebetween and connected to the first gate electrode, wherein
the second gate electrode is provided between the first signal line and the second signal line and does not overlap the first signal line or the second signal line, and
the second gate electrode includes a first section, a second section, and a connection electrode provided in a layer different from a layer of the first section and the second section.

8. The semiconductor device according to claim 7, wherein
the first section, the second section and the connection electrode are formed of a light-shielding conductive material.

9. The semiconductor device according to claim 8, wherein
an area in which the first section and the connection electrode are connected to each other does not overlap the oxide semiconductor layer.

10. The semiconductor device according to claim 8, wherein
an area in which the first section and the connection electrode are connected to each other overlaps the oxide semiconductor layer.

11. The semiconductor device according to claim 7, wherein
the first section and the second section are formed of a light-shielding conductive material, and
the connection electrode is formed of a transparent conductive material.

12. The semiconductor device according to claim 11, wherein
an area in which the first section and the connection electrode are connected to each other does not overlap the oxide semiconductor layer.

13. The semiconductor device according to claim 11, wherein
an area in which the first section and the connection electrode are connected to each other overlaps the oxide semiconductor layer.

14. The semiconductor device according to claim 7, wherein the semiconductor layer comprises a plurality of oxide semiconductor layers.

15. The semiconductor device according to claim 7, wherein the oxide semiconductor layer is a single oxide semiconductor layer.

16. A display device comprising:

a pixel;

the semiconductor device according to claim 7 and provided in the pixel, wherein the pixel is provided at an
intersection of the first signal line and the scanning line;

a pixel electrode connected to the second signal line; and a transparent electrode overlapping the scanning line and
the first signal line.

17. The display device according to claim 16, wherein the transparent electrode does not overlap the second gate
electrode.

* * * * *